(12) United States Patent
Kunai

(10) Patent No.: US 12,142,307 B2
(45) Date of Patent: Nov. 12, 2024

(54) OPTICAL MEMORY, OPTICAL DIFFRACTION ELEMENT, AND RECORDING METHOD

(71) Applicant: FUJIKURA LTD., Tokyo (JP)

(72) Inventor: Yuichiro Kunai, Tokyo (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 18/265,304

(22) PCT Filed: Aug. 20, 2021

(86) PCT No.: PCT/JP2021/030685
§ 371 (c)(1),
(2) Date: Jun. 5, 2023

(87) PCT Pub. No.: WO2022/145084
PCT Pub. Date: Jul. 7, 2022

(65) Prior Publication Data
US 2024/0038264 A1     Feb. 1, 2024

(30) Foreign Application Priority Data
Dec. 28, 2020  (JP) .................. 2020-219578

(51) Int. Cl.
| G11B 7/0045 | (2006.01) |
| G11B 7/0033 | (2006.01) |
| G11B 7/1353 | (2012.01) |
| G11B 7/1367 | (2012.01) |
| G11B 7/24035 | (2013.01) |

(52) U.S. Cl.
CPC ........ *G11B 7/00454* (2013.01); *G11B 7/0033* (2013.01); *G11B 7/1353* (2013.01); *G11B 7/1367* (2013.01); *G11B 7/24035* (2013.01)

(58) Field of Classification Search
None
See application file for complete search history.

(56) References Cited

U.S. PATENT DOCUMENTS

| 6,387,530 B1* | 5/2002 | Liu | G11B 5/855 |
| 2002/0006580 A1* | 1/2002 | Ishimaru | B01J 13/0026 |
| 2006/0280106 A1* | 12/2006 | 'T Hooft | G11B 7/24 |

(Continued)

FOREIGN PATENT DOCUMENTS

| JP | 2001325745 A | 11/2001 |
| JP | 2005285162 A | 10/2005 |

(Continued)

OTHER PUBLICATIONS

International Search Report issued in corresponding International Application No. PCT/JP2021/030685; mailed Nov. 16, 2021 (3 pages).

(Continued)

*Primary Examiner* — Peter Vincent Agustin
(74) *Attorney, Agent, or Firm* — Osha Bergman Watanabe & Burton LLP

(57) ABSTRACT

An optical memory includes a support and nanoparticles, each of which changes between a crystal phase and an amorphous phase when irradiated with light. The nanoparticles are supported by the support and spaced apart from each other in one or both of an in-plane direction of a face of the support and a direction normal to the face of the support.

3 Claims, 5 Drawing Sheets

(56) References Cited

U.S. PATENT DOCUMENTS

| | | | | |
|---|---|---|---|---|
| 2011/0043965 A1* | 2/2011 | Yaniv | ................ | B82Y 30/00 |
| | | | | 427/532 |
| 2011/0297358 A1* | 12/2011 | Russell | ................ | C23D 5/04 |
| | | | | 977/773 |
| 2012/0113772 A1* | 5/2012 | Shiono | ................ | G11B 7/1378 |
| 2014/0133285 A1* | 5/2014 | Fujinoki | ............ | G11B 7/24027 |
| | | | | 156/60 |
| 2024/0038264 A1* | 2/2024 | Kunai | ................ | G11B 7/24012 |

FOREIGN PATENT DOCUMENTS

| | | |
|---|---|---|
| JP | 3793040 B2 | 7/2006 |
| JP | 2010531995 A | 9/2010 |
| JP | 2013125259 A | 6/2013 |
| WO | 2011010447 A1 | 1/2011 |
| WO | 2013014935 A1 | 1/2013 |

OTHER PUBLICATIONS

Written Opinion of the International Searching Authority issued in corresponding International Application No. PCT/JP2021/030685; dated Nov. 16, 2021 (9 pages).

* cited by examiner

OPTICAL MEMORY, OPTICAL DIFFRACTION ELEMENT, AND RECORDING METHOD

BACKGROUND

Technical Field

The Present Invention Relates to an Optical Memory, a Light diffraction element, and a recording method.

Description of the Related Art

Patent Literature 1 discloses a disk-type optical memory (e.g., DVD or Blu-Ray (registered trademark) disks) including a storage material in a shape of bulk and plane. Such an optical memory is also called an optical disk. There are several types of optical disks: the read-only type, the recordable type capable of recording data once, and the rewritable type capable of rewriting data many times.

Among these, the rewritable optical disk uses a compound typified by Ge—Sb—Te-based compounds as a storage material. Such a compound is also called chalcogenide glass. Examples of the chalcogenide glass include $Ge_2Sb_2Te_5$. As used herein, the Ge—Sb—Te-based compounds are simply referred to as the GSTs.

The GSTs are phase-change-type storage materials that make use of the amorphous phase and the crystal phase. The amorphous phase is obtained when a GST that has been heated to a temperature of not less than the melting point is rapidly cooled. Furthermore, the crystal phase is obtained when the amorphous phase is annealed at a temperature of not less than the glass transition temperature and not more than the melting point. In an optical disk, each section of the storage material is irradiated with laser light for writing. In such an optical disk, this laser light is used to heat each section of the storage material to a temperature within a predetermined temperature range, to thereby cause the phase change.

It should be noted that the amorphous phase and the crystal phase are different in optical properties, such as refractive index of light, absorption rate of light, and reflectance of light. Thus, the optical disk is capable of being read as to whether respective sections of the storage material are in the amorphous phase or in the crystal phase by using light for readout.

PATENT LITERATURE

Patent Literature 1: Japanese Patent Publication No. 2001-325745

In a rewritable optical disk, a GST, serving as a storage material, is provided on a disk-shape resin substrate in such a manner as to uniformly cover the entire surface of an effective region of the substrate. In this way, such a rewritable optical disk employs a plane-type storage material or a storage material having an uneven structure, so-called recessed grooves or lands. In such a rewritable optical disk employing any of the storage materials, a layer of the storage material is formed to be a continuum in a bulk size. Thus, the volume of the GST constituting the storage material is remarkably greater than that of the respective sections of the storage material. For the following reasons, the phase change in respective sections requires greater power and/or energy of light, and thus, the energy efficiency is low. The first reason is that high energy is required for the phase transition caused in the continuum in the bulk size, and the second reason is that the heat generated due to absorption of the laser light is likely to decrease because the heat is likely to diverge outwardly from the irradiation spot owing to thermal conductivity.

SUMMARY

One or more embodiments increase the energy efficiency in a phase change in each section in the optical memory.

An optical memory in accordance with one or more embodiments includes: a support; and a plurality of nanoparticles made of a phase change material that changes in phase between a crystal phase and an amorphous phase when irradiated with light, the nanoparticles being supported by the support. In the present optical memory, the nanoparticles are spaced apart from each other in at least one direction selected from the group consisting of an in-plane direction of a specific face and a direction normal to the specific face.

A light diffraction element in accordance with one or more embodiments includes: a plurality of cells having respective thicknesses or respective refractive indexes set independently of each other; and the optical memory according to one or more embodiments described above, the optical memory being directly or indirectly disposed on the plurality of cells. In the present light diffraction element, regions each obtained by projecting a bottom face of each of the cells onto the specific face are defined as sections of the optical memory, and one or more nanoparticles of the plurality of nanoparticles are arranged in each of the sections.

A recording method in accordance with one or more embodiments is a recording method that uses an optical memory, the optical memory including a plurality of nanoparticles made of a phase change material that changes in phase between a crystal phase and an amorphous phase when irradiated with light, the nanoparticles being spaced apart from each other in a specific in-plane direction. The present recording method includes: a first step of causing a plurality of signal light waves to enter the optical memory, the signal light waves each having a spatial intensity distribution that represents specific information, the plurality of signal light waves being generated at time intervals; and a second step of recording, on the optical memory, each of the signal light waves which serve as light for writing.

According to one or more embodiments, it is possible to increase the energy efficiency in a phase change in each section in the optical memory.

DESCRIPTION OF THE EMBODIMENTS

First Example

<Configuration of Optical Memory>

Figure 1:
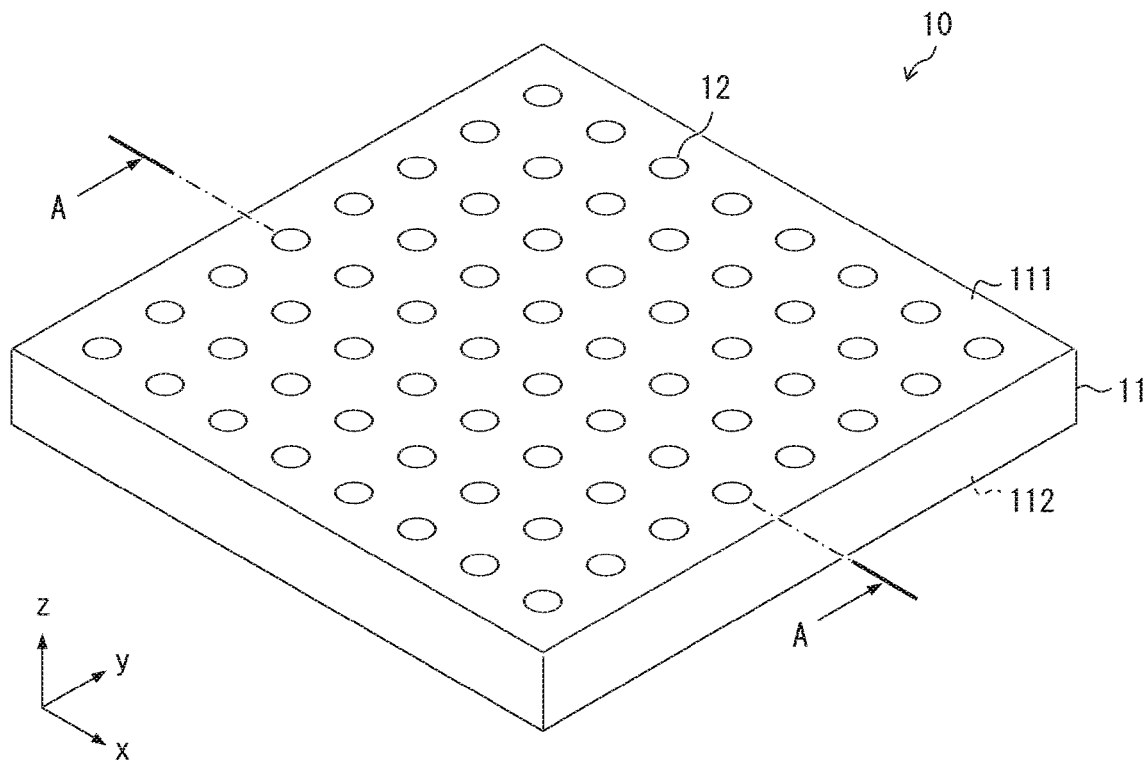
FIG. 1 is an enlarged perspective view of a part of an optical memory in accordance with a first example.
Figure 2:
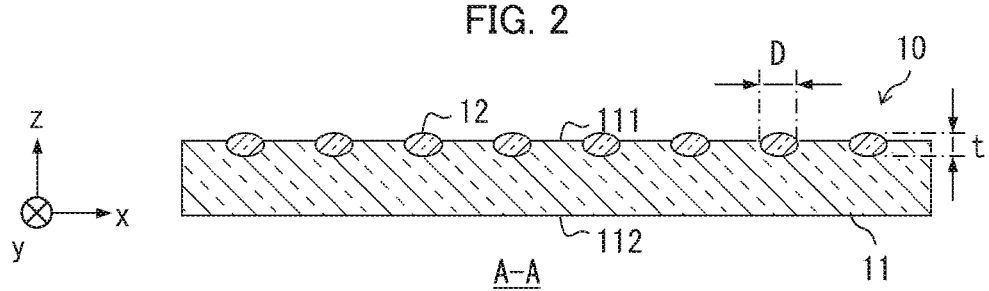
FIG. 2 is a cross-sectional view of the optical memory illustrated in FIG. 1.

An optical memory 10 in accordance with a first example will be described with reference to FIGS. 1 and 2. FIG. 1 is an enlarged perspective view of a part of the optical memory 10. FIG. 2 is an enlarged cross-sectional view of the part of the optical memory 10 taken along line A-A indicated in FIG. 1. As illustrated in FIG. 1, the optical memory 10 includes a support 11 and a plurality of nanoparticles 12.

(Support)

As illustrated in FIG. 1, the support 11 is a layer-like member that extends two-dimensionally. In FIG. 1, an orthogonal coordinate system is defined such that main faces 111, 112, which are a pair of main faces of the support 11, extend parallel to the xy plane, that is, a direction normal to the main faces 111, 112 extends parallel to the z-axis direction. The main face 111 is an example of a specific face, and an in-plane direction of the main face 111 is an example of a specific in-plane direction. Further, the direction parallel to the z-axis direction is an example of a direction normal to the specific face. As used herein, the direction normal to the specific face is referred to as the thickness direction. It should be noted that the thickness of the support 11 is not limited thereto, and may be appropriately chosen.

FIG. 1 depicts the support 11 in a state in which the support 11 is solely disposed without any support of any other member (e.g., a substrate). The support 11 may be solely disposed apart from any other member in this way, or alternatively, may be supported by any other member such as a substrate. For example, the support 11 may be supported by a substrate by forming the support 11 on one of main faces of the substrate.

The support 11 may be preferably made of an optically transparent material. In the first example, a methacrylic resin is employed as a material of which the support 11 is made. However, the optically transparent material is not limited to methacrylic resins, and may be selected from general vinyl resins, polyimides, polyethers, polyesters, polyols, epoxies, olefins, alicyclic olefins, and the like. Further, the optically transparent material may be a glass typified by quartz glass. Furthermore, in a case in which the support 11 is supported by a substrate, a material of which the support 11 is made may be preferably have an optically transparent property in a similar manner.

Further, in the first example, the support 11 is arranged along a plane so that the main faces 111, 112 are parallel to the xy plane. However, the support 11 may be arranged along a curved surface.

(Nanoparticles)

Each of the nanoparticles 12 functions as a storage material for storing the information in a nonvolatile fashion in the optical memory 10. Each of the nanoparticles 12 is made of a phase change material that changes in phase between the crystal phase and the amorphous phase when irradiated with light. In the first example, the material of which each of the nanoparticles 12 is made is $Ge_2Sb_2Te_5$. $Ge_2Sb_2Te_5$ is an example of Ge—Sb—Te-based compounds, which are also referred to as chalcogenide glass. Hereinafter, the Ge—Sb—Te-based compounds is simply referred to as the "GSTs", and $Ge_2Sb_2Te_5$ is referred to as "GST225". GST225 has an optically transparent property.

It should be noted that the material of which each of the nanoparticles 12 is made is not limited to GST225. The material of which each of the nanoparticles 12 is made may be appropriately chosen from phase change materials that change in phase between two phases in accordance with energy of light and/or heat. For example, binary compounds such as Sb—Te and multinary compounds obtained by adding a small amount of Ge, Ag, In, or the like, to the binary compounds, may be suitably used besides quasi-two-dimensional compounds such as the GSTs. Suitable examples of the multinary compounds includes Ag—In—Sb—Te (AIST) and Ge—Sb—Se—Te (GSST). Thus, the phase change material may be appropriately chosen from materials that have been employed as storage materials of rewritable DVD and Blu-Ray (registered trademark) disks.

GST225 is capable of altering between the amorphous phase and the crystal phase in accordance with the hysteresis of temperature to which GST225 has been exposed. When GST225 which is in the liquid phase due to heating to melting point Tm or more is rapidly cooled, the phase of GST225 changes to the amorphous phase. Furthermore, when the amorphous phase is annealed at a temperature of not less than glass transition temperature Tg and not more than melting point Tm, the phase changes to the crystal phase. In the optical memory 10, each of the nanoparticles 12 is irradiated with light for writing, like optical disks. Hereinafter, the light for writing is also referred to as the "signal light". In the optical memory 10, the phase change is carried out by heating each of the nanoparticles 12 to a predetermined temperature range by means of the signal light.

It should be noted that the amorphous phase and the crystal phase are different in optical properties, such as refractive index of light, absorption rate of light, and reflectance of light. Thus, the optical memory 10 is capable of being read as to whether respective nanoparticles 12 are in the amorphous phase or in the crystal phase by means of light for readout.

In the first example, diameter D of each nanoparticle 12, which is a particle size in a specific in-plane direction of the nanoparticle 12, is 100 nm. However, from the viewpoint of increase in the energy efficiency in a phase change, a lesser diameter D is preferable. For example, a diameter D of not more than 50 nm is preferable. However, the diameter D is not limited thereto, and may be appropriately chosen from a range of the order of nanometers, that is, a range of not less than 1 nm and less than 1000 nm. In a case in which the shape of each nanoparticle 12 in the specific in-plane direction is not a circle, the diameter of the circumcircle of each nanoparticle 12 may be used as the diameter D.

Further, in the first example, thickness t of each nanoparticle 12 is 60 nm, which is less than the diameter D. However, the thickness t is not limited thereto, and may be substantially equal to the diameter D, or may exceed the diameter D.

In the first example, a part of each nanoparticle 12 is embedded in the support 11 (see FIG. 2). In this way, each nanoparticle 12 is supported by the support 11. However, each nanoparticle 12 may be embedded in the support 11 in its entirety. For example, in an optical memory 10A, which will be described below with reference to FIG. 3, each of i-th nanoparticles 12i is embedded in the support 11A in its entirety.

The nanoparticles 12 are arranged in such a manner so as to be spaced apart from each other in the in-plane direction of the main face 111. It may also be construed that the nanoparticles 12 are scattered in a layer-like fashion (in a two-dimensional manner) in the surface of the main face 111. In the first example, tetragonal lattice is employed as the arrangement pattern of the nanoparticles 12 in the specific in-plane direction. However, the arrangement pattern of the nanoparticles 12 in the specific in-plane direction is not limited thereto, and may be appropriately chosen. However, the arrangement pattern may be preferably a periodic arrangement pattern, and the nanoparticles 12 may be preferably arranged in a periodic manner. Examples of the arrangement pattern other than the tetragonal lattice may include hexagonal lattice.

<Variation>

Figure 3:
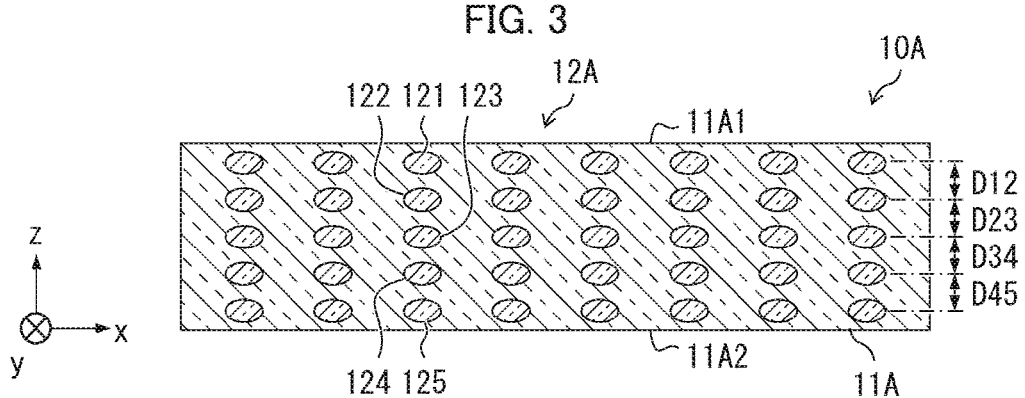
FIG. 3 is a cross-sectional view of an optical memory which is a variation of the optical memory illustrated in FIG. 1.

An optical memory 10A, which is a variation of the optical memory 10, will be described with reference to FIG. 3. FIG. 3 is an enlarged cross-sectional view of a part of the optical memory 10A. FIG. 3 is a cross-sectional view corresponding to the A-A cross-sectional view of the optical memory 10 illustrated in FIG. 2. It should be noted that a support 11A, main faces 11A1, 11A2, and nanoparticles 12A of the optical memory 10A correspond to the support 11, the main faces 111, 112, and the nanoparticles 12 of the optical memory 10, respectively.

In the optical memory 10, a part of each of the nanoparticles 12 is embedded in the support 11, and the nanoparticles 12 are scattered in a layer-like fashion (in a two-dimensional manner) in the surface of the main face 111.

In contrast, in the optical memory 10A, the nanoparticles 12A include first nanoparticles 121, second nanoparticles 122, third nanoparticles 123, fourth nanoparticles 124, and fifth nanoparticles 125. Hereinafter, when there is no need to distinguish the first to fifth nanoparticles 121 to 125, those nanoparticles are also referred to as i-th nanoparticles 12*i* (i is an integer of not less than 1 and not more than 5).

Nanoparticles included in each of the i-th nanoparticles 12*i* are scattered in a layer-like fashion, like the nanoparticles 12 of the optical memory 10. However, the i-th nanoparticles 12*i* are different in scattering depth (the distance from the main face 11A1 in the thickness direction), compared to the nanoparticles 12. The first nanoparticles 121 are located near the main face 11A1 inside the support 11A. The second nanoparticles 122 are located below the first nanoparticles 121 (on a side of the negative z-axis direction) at locations spaced apart by distance D12. The third nanoparticles 123 are located below the second nanoparticles 122 (on a side of the negative z-axis direction) at locations spaced apart by distance D23. The fourth nanoparticles 124 are located below the third nanoparticles 123 (on a side of the negative z-axis direction) at locations spaced apart by distance D34. The fifth nanoparticles 125 are located below the fourth nanoparticles 124 (on a side of the negative z-axis direction) at locations spaced apart by distance D45. In this way, the i-th nanoparticles 12*i* are arranged in layers inside the support 11A.

In addition, nanoparticles included in the respective i-th nanoparticles 12*i* are arranged uniaxially in the thickness direction (see FIG. 3).

In this way, the optical memory 10A includes a plurality of nanoparticle groups when it is assumed that every five uniaxially-aligned nanoparticles of the first nanoparticles 121 to the fifth nanoparticles 125 arranged along the thickness direction constitute a nanoparticle group. The nanoparticle groups are spaced apart from each other when viewed in the direction normal to the main face 11A1. Thus, the optical memory 10A is an example of an optical memory in which some of the nanoparticles 12A are arranged in the thickness direction. However, a variation of the optical memory 10A may employ a configuration in which only one nanoparticle group is included. This variation of the optical memory 10A may be an example of an optical memory in which all of the nanoparticles 12A are arrange in the thickness direction.

<Method of Manufacturing Optical Memories>

The optical memory 10 illustrated in FIGS. 1 and 2, and the optical memory 10A illustrated in FIG. 3 may be manufactured by combining a deposition technique, which typically includes sputtering and vacuum evaporation, and a fine-processing technique, which typically includes photolithography and electron-beam lithography. Further, suitably used techniques may include, for example, various techniques capable of performing selective etching and selective deposition by, for example, a focused ion beam (FIB), and a technique for selectively performing additional deposition of a layer of atoms one by one, which is called an atomic layer deposition (ALD).

Further, to manufacture the nanoparticles 12, 12A, a hot injection technique for use in manufacture of quantum dots, a nanoparticle manufacturing technique in which a microreactor is used, and the sol-gel method for use in forming of silica, titanium oxide, or the like, can be used, for example. However, the techniques for manufacturing the nanoparticles 12, 12A are not limited thereto. As mentioned above, a method in which a flat layer of a desired phase change material may be deposited by, for example, sputtering or vacuum evaporation, and then the obtained layer may be subjected to etching processing so as to form the layer into nanoparticles by, for example, lithography, may be employed.

Further, to manufacture the optical memories 10, 10A and the nanoparticles 12, 12A, a technique for forming a self-assembly-type nanostructure by using block copolymers may be used. In particular, this technique can be suitably used when each nanoparticle 12 has a diameter D of not more than 400 nm. For example, a subtractive shaping method achieved by combining a conventional photolithography technique and a self-assembly technique that uses a block copolymer may be used, or alternatively, an additive processing achieved by combining the ALD, for example, and the self-assembly technique may be used. In such a subtractive shaping method, a desired pattern can be formed by performing etching processing to cut out unnecessary portions, using a fine pattern auto-plastically formed by block copolymers as a mask. Further, in such an additive shaping method, a desired shape can be formed by causing selective adsorption of atoms to one polymer chain component of a block copolymer, using, for example, the ALD. By using these methods, it is possible to form a periodic and fine (e.g., not more than 100 nm) pattern.

Second Example

<Configuration of Light Diffraction Element>

Figure 4:
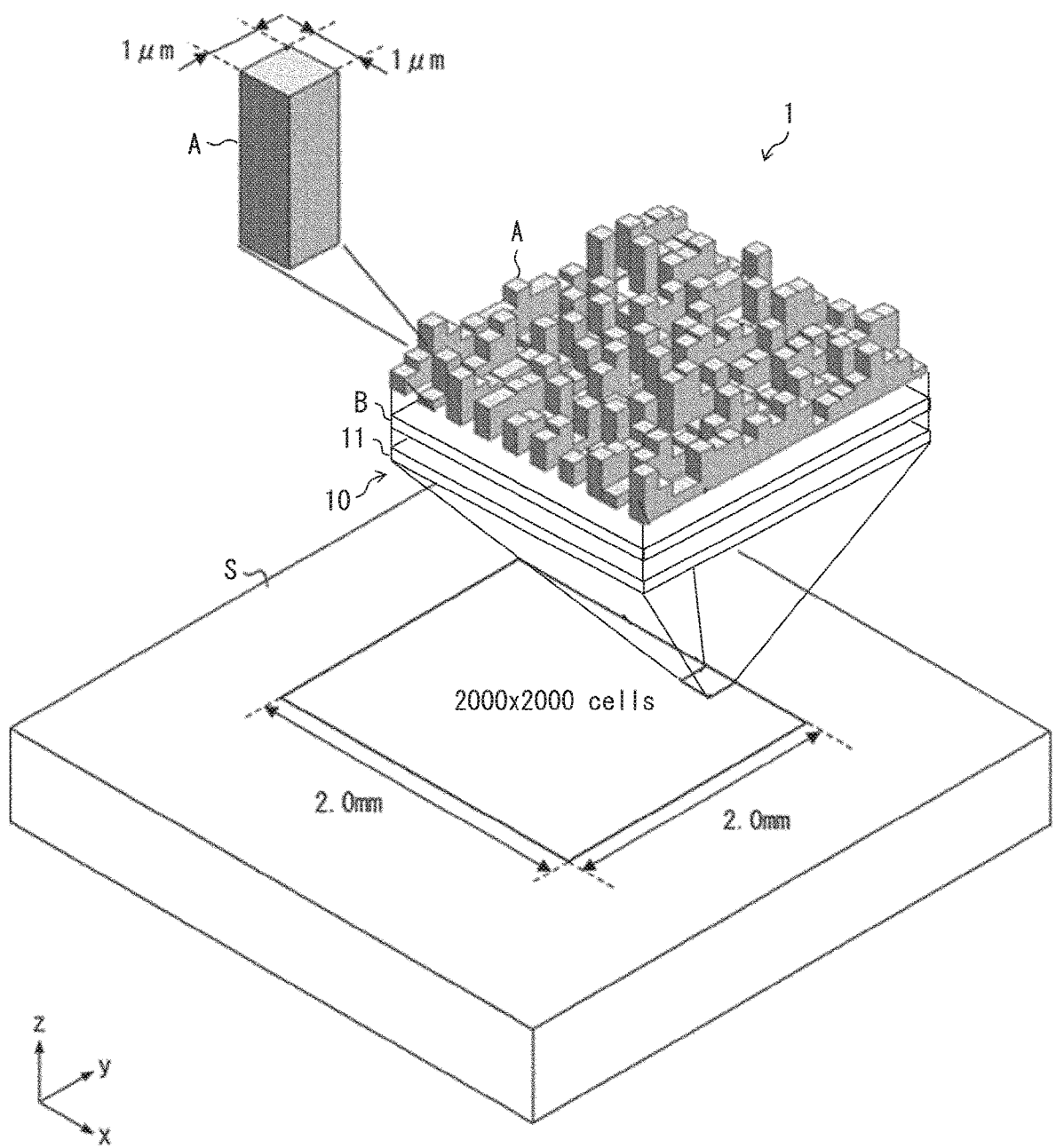
FIG. 4 is a perspective view of a light diffraction element in accordance with a second example.
Figure 5:
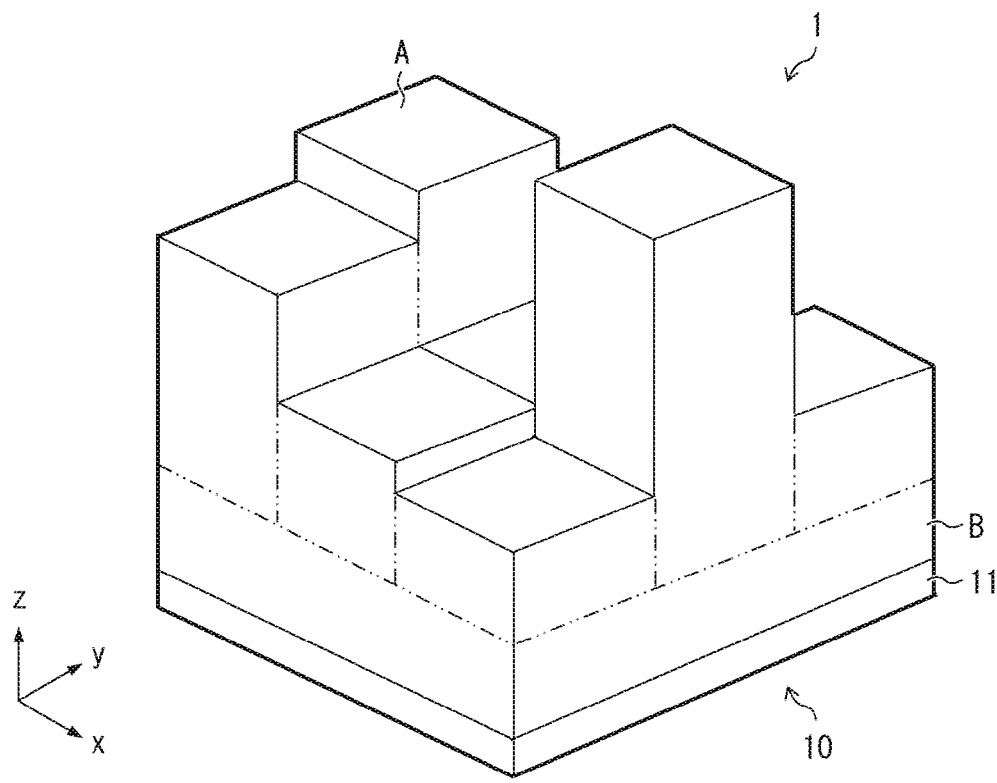
FIG. 5 is an enlarged perspective view of a part of the light diffraction element illustrated in FIG. 4.
Figure 6:
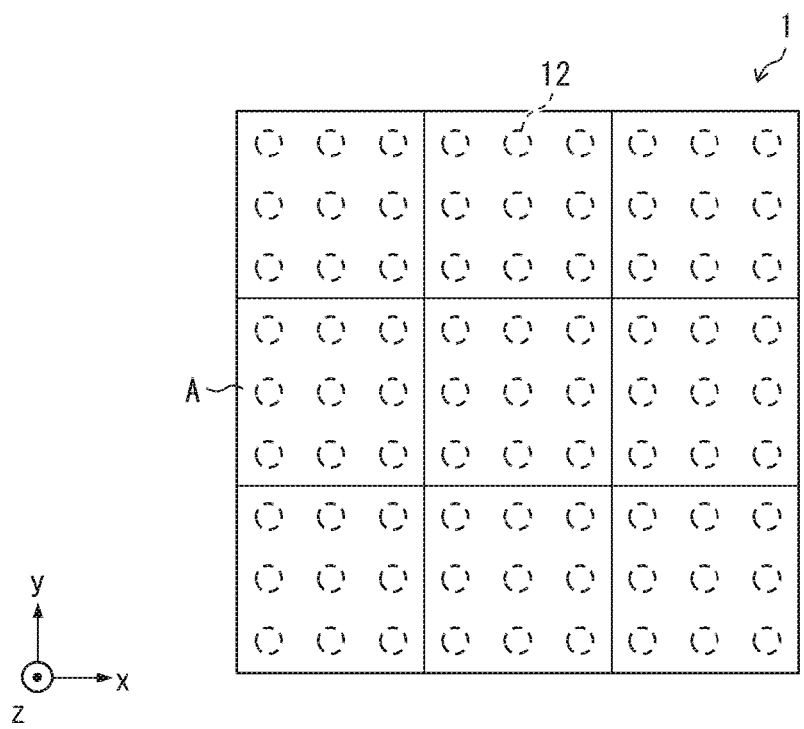
FIG. 6 is an enlarged plan view of the part of the light diffraction element illustrated in FIG. 4.

A light diffraction element 1 in accordance with a second example will be described with reference to FIGS. 4 to 6. FIG. 4 is a perspective view of a light diffraction element 1. FIG. 5 is an enlarged perspective view of a part (corresponding to nine cells) of the light diffraction element 1. FIG. 6 is an enlarged plan view of the part (corresponding to nine cells) of the light diffraction element 1, when viewed in a direction parallel to a normal of the main face of the support 11 (main faces 111, 112 illustrated in FIG. 1) (in the z-axis direction). It should be noted that, in FIGS. 5 and 6, a substrate S included in the light diffraction element 1 is not illustrated.

As illustrated in FIG. 4, the light diffraction element 1 is a planar light diffraction element, and includes: a plurality of microcells A having respective thicknesses or respective refractive indexes set independently of each other; a base B; the optical memory 10 described in the first example; and the substrate S.

(Microcells)

Each of the microcells A is an example of a cell and is made of an optically transparent resin. When signal light enters the light diffraction element 1, signal light waves that have been transmitted through the respective microcells A interfere with each other, so that predetermined optical computing is carried out. The intensity distribution of signal light outputted from the light diffraction element 1 shows a result of the signal light.

As used herein, the term "microcell" refers to a cell having a cell size of, for example, less than 10 μm. Further, the term "cell size" refers to the square root of the area of a cell. For example, when the shape of the microcell in plan view is a square, the cell size is the length of the sides of the cell. A lower limit of the cell size is not particularly limited and can be, for example, 1 nm.

The light diffraction element 1 illustrated in FIG. 4 includes 2000×2000 microcells A arranged in a matrix pattern. The shape of each microcell A in plan view is, for example, a 1 μm×1 μm square, and the shape of the light diffraction element 1 in plan view is, for example, a 2 mm×2 mm square.

The cell size, the shape of each microcell A in plan view, and the shape of the light diffraction element 1 in plan view are not limited to the above examples, and may be determined as appropriate.

A phase shift amount of light transmitted through microcells A can be independently set for each cell by (1) independently setting a thickness of a microcell A for each cell, or (2) independently setting a refractive index of a microcell A for each cell. In the second example, each microcell A is constituted by a quadrangular prism-shaped pillar having a square bottom face with four sides that are all equal to the cell size, as illustrated in FIG. 4. In this case, the phase shift amount of light transmitted through a microcell A varies in accordance with the height of the pillar. That is, as the height of the pillar constituting the microcell A increases, the phase shift amount of light transmitted through the microcell A increases, and as the height of the pillar constituting the microcell A decreases, the phase shift amount of light transmitted through the microcell A decreases.

(Base)

The base B is made of the same resin as the resin of which the microcells A are made. The thickness of the base B is, for example, 100 μm, but it is not limited thereto. It should be noted that, to facilitate understanding of the configuration of the light diffraction element 1, FIG. 4 merely depicts the base B and the microcells A of the light diffraction element 1 in an exploded fashion. The base B and the microcells A are manufactured as an integrated light diffraction element 1 by using the same resin. Thus, in FIG. 5, the boundaries between the base B and the microcells A are indicated by virtual lines (dot-dot-dash lines), like the boundaries between adjacent microcells A.

(Optical Memory)

The optical memory 10 illustrated in FIG. 4 is configured identical to the optical memory 10 described above with reference to FIGS. 1 and 2 in the first example. Therefore, in the second example, the optical memory 10 and each member constituting the optical memory 10 are given identical referential numerals, and their descriptions are omitted. In the second example, the optical memory 10 is located between the substrate S, which will be described below, and the base B of the light diffraction element 1.

In the second example, out of the plurality of nanoparticles 12, every nine nanoparticles 12 that form a group in the in-plane direction of the main face of the support 11 constitute a section in the optical memory 10 (see FIG. 6). In addition, each microcell A is allocated one of the sections each including nine nanoparticles 12.

When light having a spatial intensity distribution (i.e., signal light) enters the light diffraction element 1, the light diffraction element 1 converts the spatial intensity distribution of the incident light to another spatial intensity distribution in accordance with the thickness or the refractive index of each microcell A, and then outputs the light having the converted spatial intensity distribution. Since each of the microcells A corresponds to one section (i.e., in one-to-one correspondence), the light diffraction element 1 can use signal light having a spatial intensity distribution as light for writing, so that a converted spatial intensity distribution converted by the light diffraction element 1 can be recorded.

It should be noted that the light diffraction element 1 may use, instead of the signal light having the spatial intensity distribution serving as light for writing, another light for writing that is different from the signal light, to perform some kind of writing into the plurality of nanoparticles 12 of the optical memory 10. By performing some kind of writing into the plurality of nanoparticles 12 of the optical memory 10, it is possible to change the phase shift amount of light transmitted through the respective microcells A. Thus, in the light diffraction element 1, the optical memory 10 functions as a phase shift amount varying mechanism capable of performing posterior adjustments of the phase shift amount of light transmitted through the respective microcells A.

(Substrate)

The substrate S is a plate member made of an optically transparent material. In the second example, quartz glass is used as an optically transparent material. The optically transparent material is not limited to quartz glass, and may be chosen as appropriate. The optical memory 10, the base B, and the plurality of microcells A are layered in this order on one of the main faces of the substrate S. Here, the light diffraction element 1 employs a transmissive configuration. However, the light diffraction element in accordance with an aspect of the present invention is not limited to the transmissive configuration, and may employ a reflective configuration. In a case of a reflective light diffraction element, a substrate having a main face that is made of a specular surface may be used instead of the substrate S made of an optically transparent material. Further, there may be employed a configuration in which an additional substrate having a main face made of a specular surface is disposed on a main face which is one of the pair of the main faces of the substrate S, on which main face no optical memory 10 is formed.

<Variation of Optical Memory>

In the light diffraction element 1, the optical memory 10A illustrated in FIG. 3 may be used instead of the optical memory 10 illustrated in FIGS. 1 and 2. By using the optical memory 10A instead of the optical memory 10, it is possible to record converted spatial intensity distributions converted by the light diffraction element 1 in multiple levels.

Further, also in a case in which the optical memory 10A is used instead of the optical memory 10, the optical memory 10A may be used as a phase shift amount varying mechanism. In the optical memory 10A, five layers of the i-th nanoparticles 12i are arranged along the thickness direction of the support 11A. Thus, the optical memory 10A is capable of increasing the adjustment range in changing the phase shift amount of light transmitted through the respective microcells A, compared to the optical memory 10. Thus, according to this configuration, it is possible to provide the light diffraction element 1 having a wider adjustment range of the phase shift amount in the respective microcells A.

<Multistage Light Diffraction Element>

Figure 7:
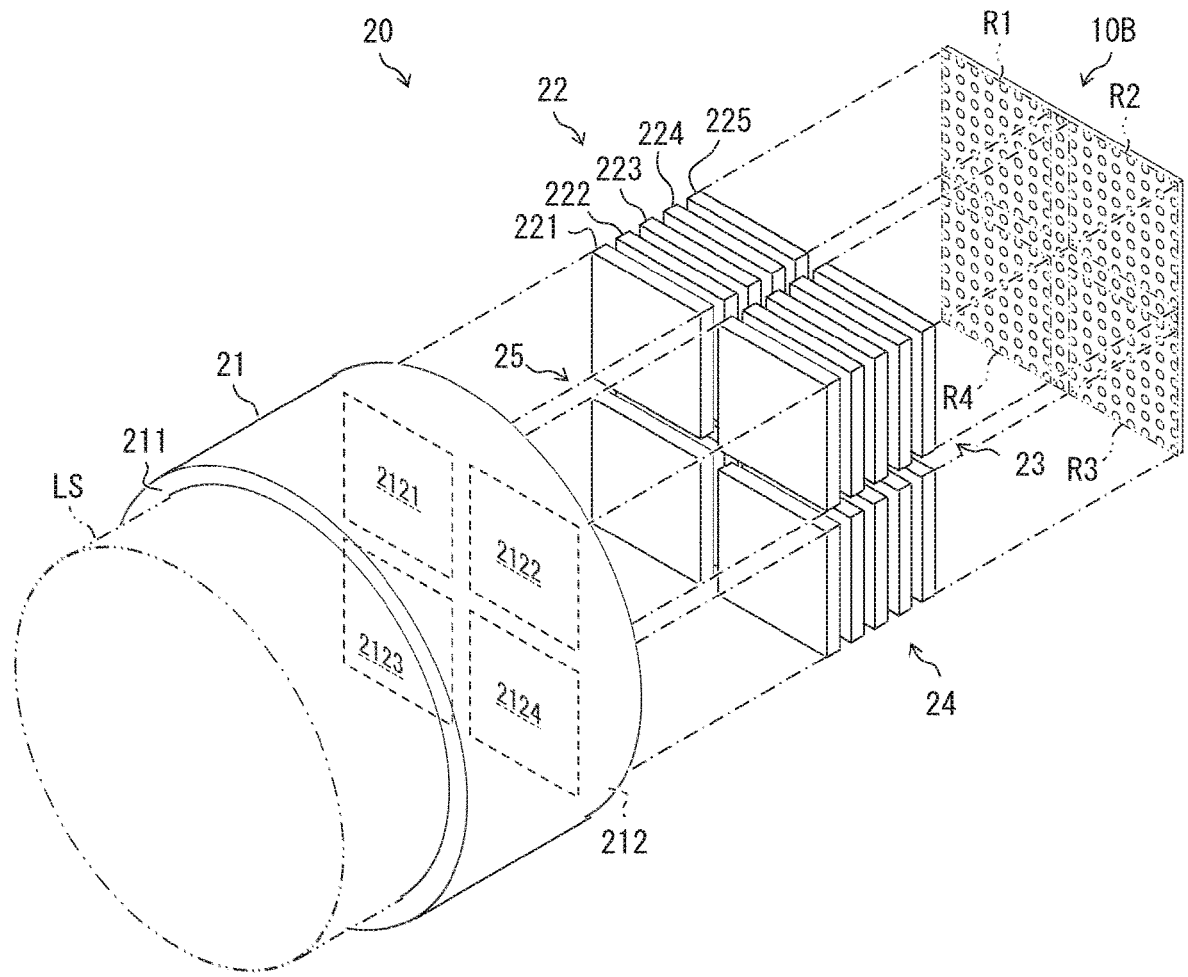
FIG. 7 is a perspective view of a recording system in accordance with a third example.

The second example has been described based on the assumption that one light diffraction element 1 is provided with the optical memory 10, as illustrated in FIGS. 4 and 5. However, as described below with reference to FIG. 7, a multistage light diffraction element (e.g., light diffraction elements 221 to 225) in which the light diffraction elements each being configured similarly to the light diffraction element 1 are layered may be used, and the optical memory 10 (optical memory 10B in FIG. 7) may be disposed at a stage that follows the last light diffraction element (e.g., the light diffraction element 225). Since the light diffraction elements 221 to 225 sequentially act on signal light having a spatial intensity distribution, the multistage light diffraction element functions as an optical computing device. In this case, the optical memory 10 is disposed at the stage that follows the light diffraction element 225, it is possible to record optical computation results obtained by the light diffraction elements 221 to 225. Here, this multistage light diffraction element may be transmissive as illustrated in FIG. 7, or alternatively, may be reflective.

Further, as illustrated in FIGS. 4 and 5, an optical computing device may be constituted by layering a plurality of light diffraction elements 1, each light diffraction element 1 being provided with one optical memory 10. In this case, since it is possible to perform posterior adjustments of the phase shift amount of light transmitted through the respective microcells A in the respective light diffraction elements 221 to 225, it is possible to provide an optical computing device capable of performing posterior adjustments of computation matters. In this case, use of the optical memory 10A instead of the optical memory 10 increases the adjustment ranges in the respective light diffraction elements 221 to 225.

Third Example

<Configuration of Recording System>

Figure 8:
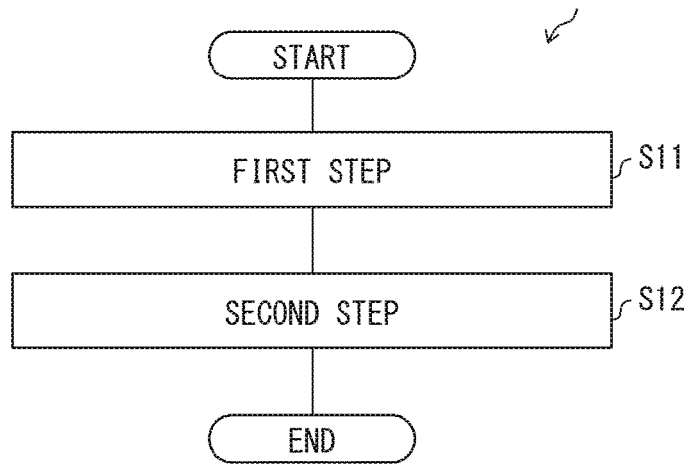
FIG. 8 is a flowchart of a recording method executed by the recording system illustrated in FIG. 7.
Figure 9:
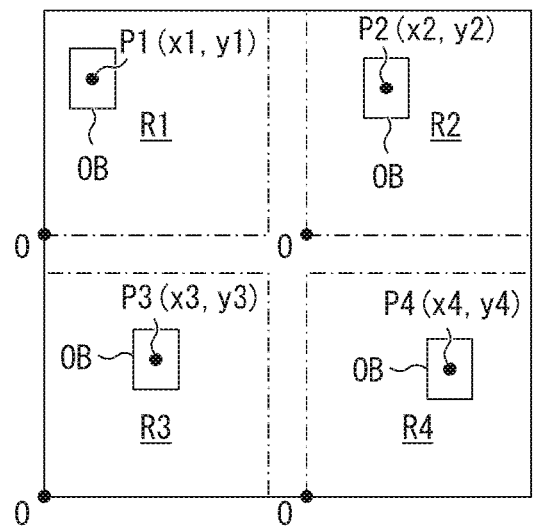
FIG. 9 is a schematic view illustrating information recorded by the recording method illustrated in FIG. 8.
Figure 10:
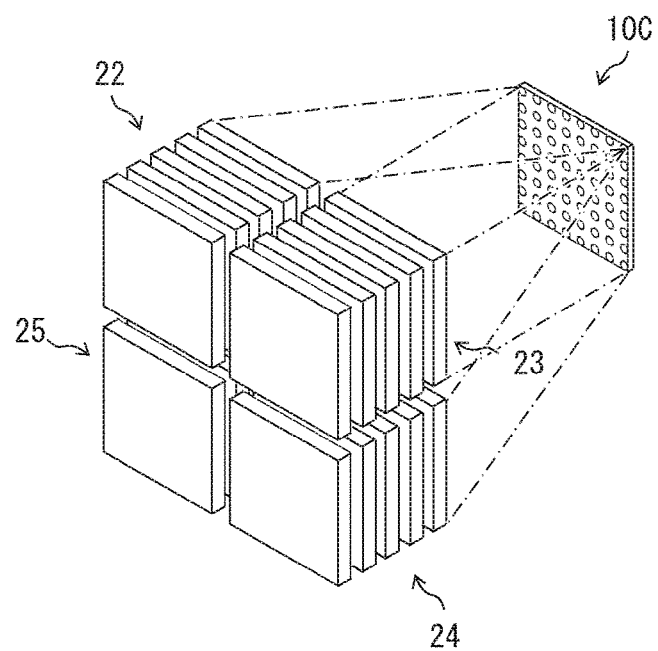
FIG. 10 is a perspective view of an optical computing device and an optical memory, which constitute a recording system, which is a variation of the recording system in accordance with the third example.

A recording system 20 in accordance with a third example will be described with reference to FIGS. 7 to 10. FIG. 7 is a perspective view of the recording system 20. FIG. 8 is a flowchart of a recording method M10 executed by the recording system 20. FIG. 9 is a schematic view illustrating information recorded by the recording method M10. FIG. 10 is a perspective view of optical computing devices 22 to 24 and an optical memory 10C, which constitute a recording system 20C, which is a variation of the recording system 20.

As illustrated in FIG. 7, the recording system 20 includes a beam splitter 21, four optical computing devices 22 to 25, and the optical memory 10B.

(Beam Splitter 21)

The beam splitter 21 is a tunnel-type beam splitter that has an entry face 211 and an exit face 212. The exit face 212 includes a first region 2121, a second region 2122, a third region 2123, and a fourth region 2124. On each region, a still image taken at different timing is formed.

The beam splitter 21 includes a dividing and projecting section and a delay generating section, which are not illustrated in FIG. 7. The dividing and projecting section divides a time-varying image that has entered by the entry face 211, into a plurality of (four, according to the third example) time-varying subimages, and then, projects the time-varying subimages. At this point in time, the four time-varying subimages obtained by the division and subjected to the projection are the same. Alternatively, the beam splitter 21 may be, for example, a device that is provided with, at a stage following a typical beam splitter, a mechanism capable of generating time differences like a rotating light chopper. Furthermore, a device having a specific configuration having both functions, such as a device for use in high-speed cameras, may be suitably used.

The delay generating section generates a still image from each of the four time-varying subimages in such a manner as to change capturing timings. Hereinafter, still images generated from the respective time-varying subimages are referred to as a first still image, a second still image, a third still image, and a fourth still image in the order of being captured. The delay generating section forms images of the first to fourth still images on the corresponding first to fourth regions 2121 to 2124.

The time differences in capturing timing between temporally adjacent still images of the first to fourth still images are always the same. That is, the delay time between the first still image and the second still image, the delay time between the second still image and the third still image, and the delay time between the third still image and the fourth still image are the same. These delay times may be set as appropriate in accordance with a target subject; in the third example, the delay times may be appropriately set within a range of not less than 10 nanoseconds and not more than 2 milliseconds. By setting the delay times within this range, it is possible to take respective still images in higher speed than that of a typical and commercially-available high speed camera.

(Optical Computing Device)

The respective optical computing devices 22 to 25 have the same configuration. Accordingly, described in the foregoing is the optical computing device 22.

The optical computing device 22 is constituted by five light diffraction elements 221 to 225 (see FIG. 7). The light diffraction elements 221 to 225 are layered in this order so that effective regions of the light diffraction elements 221 to 225, that is, regions in which microcells A are formed, are aligned with each other when the entry face of the light diffraction element 221 is viewed from the beam splitter 21 side. The light diffraction elements 221 to 225 thus layered function as an optical computing device by sequentially acting on signal light having a spatial intensity distribution.

Thus, the optical computing device 22 outputs, to the downstream, a computation result, which is a result of sequential acting of the light diffraction elements 221 to 225 on the signal light, using the first still image formed on the first region 2121 as the signal light.

Similarly, each of the optical computing devices 23 to 25 outputs, to the downstream, a computation result, which is a result of sequential acting of five light diffraction elements on signal light, using the corresponding still image of the second to fourth still images formed on the second to fourth regions 2122 to 2124, respectively, as the signal light.

(Optical Memory)

The optical memory 10B is an optical memory that has a configuration similar to that of the optical memory 10 illustrated in FIGS. 1 and 2. The optical memory 10B has a light receiving face that is divided into a first to fourth regions R1 to R4.

Each of the first to fourth regions R1 to R4 is arranged in such a manner as to face the fifth light diffraction element of the corresponding optical computing device 22 to 25. In this configuration, the first region R1 records a result obtained by subjecting the first still image to the optical computing by the optical computing device 22. Similarly, the second region R2 records a result obtained by subjecting the second still image to the computing by the optical computing device 23, the third region R3 records a result obtained by subjecting the third still image to the computing by the optical computing device 24, and the fourth region R4 records a result obtained by subjecting the fourth still image to the computing by the optical computing device 25. Thus, the optical memory 10B records, in the corresponding first to fourth regions R1 to R4, results obtained by subjecting the first to fourth still images to optical computing by the corresponding optical computing devices 22 to 25.

As discussed in the foregoing, in the recording system 20, the corresponding optical computing devices 22 to 25 can subject a plurality of still images, which are generated at slight time intervals by using the delay generating section of the beam splitter 21, to optical computing, and the optical computation results can be recorded.

(Recording Method)

The recording method M10 carried out by the recording system 20 includes a first step S11 and a second step S12, as illustrated in FIG. 8.

The first step S11 is a step of causing the first to fourth still images generated at time intervals by using the delay generating section of the beam splitter 21 to enter the first to fourth regions R1 to R4 of the optical memory 10B, respectively. Each of the first to fourth still images is an example of a plurality of signal light waves each having a spatial intensity distribution that represents specific information.

The second step S12 is a step of writing, into the optical memory 10B, each of the first to fourth still images which serve as light for writing.

It should be noted that, in the second step S12, each of the first to fourth still images may be recorded in the corresponding first to fourth regions R1 to R4, which are separated regions in the optical memory 10B, as described in the foregoing, or alternatively, may be recorded in a single region, like the optical memory 10C illustrated in FIG. 10.

(Readout of Recorded Information)

Although not illustrated in FIG. 7, the recording system 20 includes: a light source that emits light for readout to read information recorded on the optical memory 10B; an optical system configured to make the entire surface of the optical memory 10B irradiated with the light for readout; and a light detecting section that detects light that has been transmitted through the optical memory 10B.

The light for readout is light different from the first to fourth still images, which are signal light for writing. By use of the optical system, the entire surface of the optical memory 10B is irradiated with the light for readout through a gap provided between the optical computing devices 22 to 25 and the optical memory 10B.

The light detecting section is a light sensor array in which a plurality of light sensors are arranged in a matrix pattern so as to detect light that has been transmitted through the respective nanoparticles 12 constituting the optical memory 10B.

Out of the nanoparticles 12, nanoparticles 12 in the crystal phase and nanoparticles 12 in the amorphous phase are different in refractive index and absorption rate of light. This enables a control section of the recording system 20 to obtain the spatial intensity distribution of light in accordance with a light intensity signal outputted from the light sensor array of the light detecting section. Thus, the control section can read, as the spatial intensity distribution of light, information written into the optical memory 10B.

FIG. 9 illustrates an example of information recorded by the recording method M10. As illustrated in FIG. 9, light intensity signals outputted from the light sensor array of the light detecting section are associated with the respective first to fourth regions R1 to R4 of the optical memory 10B. In the third example, the lower left point in each of the first to fourth regions R1 to R4 is defined as the origin in a state illustrated in FIG. 9.

The control section determines whether each of the first to fourth regions R1 to R4 includes any kind of object OB. When all of the first to fourth regions R1 to R4 include some kind of object OB, the control section calculates the coordinates of points P1 to P4, each of which is the barycenter of the object OB. The control section is capable of estimating a locus of the object OB by using the coordinates of points P1 to P4.

The recording system 20 having the configuration as described in the foregoing is capable of detecting the presence of a physical object (e.g., a flying object) that moves at high speed, and predicting the motion of the physical object. For example, in a case in which the recording system 20 is mounted on a moving object (e.g., a drone), the moving object can detect the presence of an object that is moving at a high speed and is likely to obstruct or collide with the moving object, and then, the moving object can predict the motion of the object, so that it is possible to control the motion of the moving object on the basis of the results of the prediction. Thus, this moving object is capable of avoiding collision or the like with the object.

Aspects of one or more embodiments can also be expressed as follows:

An optical memory in accordance with Aspect 1 of one or more embodiments includes: a support; and a plurality of nanoparticles made of a phase change material that changes in phase between a crystal phase and an amorphous phase when irradiated with light, the nanoparticles being supported by the support. In the present optical memory, the nanoparticles are spaced apart from each other in at least one direction selected from the group consisting of an in-plane direction of a specific face and a direction normal to the specific face.

In the present optical memory, the nanoparticles spaced apart from each other in at least one direction selected from the group consisting of an in-plane direction of a specific face and a direction normal to the specific face, function as a storage material. Since the storage material is constituted by the nanoparticles each having a particle size in the order of nanometers, it is possible to reduce power and/or energy of light required to cause a phase change in each of the nanoparticles, compared to a case of a bulk and plane type optical memory. Thus, in the present optical memory, it is possible to increase the energy efficiency in a phase change in each section.

Further, an optical memory in accordance with Aspect 2 of one or more embodiments employs, in addition to the abovementioned configuration of the optical memory in accordance with Aspect 1, a configuration in which each of the nanoparticles is at least partially embedded in the support, and a thermal conductivity of a material of which the support is made is lower than a thermal conductivity of a material of which each of the nanoparticles is made.

With the above configuration, it is possible to reliably support the nanoparticles. In addition, it is possible to suppress the dissipation of energy caused by the heat conduction from the nanoparticles, because the nanoparticles are surrounded by the support that is made of the material having lower heat conductivity. Thus, it is unlikely that the heat generated when the respective nanoparticles absorb laser light for writing will be transferred to the surrounding support and other nanoparticles, so that it is possible to further increase the energy efficiency. Further, an optical memory in accordance with Aspect 3 of one or more embodiments employs, in addition to the abovementioned configuration of the optical memory in accordance with Aspect 1 or 2, a configuration in which at least some or all of the plurality of nanoparticles are arranged along the direction normal to the specific face.

With the above configuration, it is possible to control the number of nanoparticles undergoing phase changes in accordance with the power and/or energy of the laser light, when the laser light for writing is applied. Since the refractive index and the absorption rate of light of a nanoparticle alter on the basis of whether the nanoparticle is after a phase change (e.g., the nanoparticle in the amorphous phase) or before the phase change (e.g., the nanoparticle in the crystal phase), it is possible to obtain, by using laser light for readout, the number of nanoparticles that have undergone phase changes. Thus, with the present optical memory, it is possible to provide a multiple-level optical memory. Further, an optical memory in accordance with Aspect 4 of one or more embodiments employs, in addition to the abovementioned configuration of the optical memory in accordance with any one of Aspect 1 to 3, a configuration in which the nanoparticles are arranged in a periodic manner in the in-plane direction.

With the above configuration, it is possible to provide a memory array including sections arranged in a periodic manner inside the optical memory. Thus, when laser light for writing has a spatial intensity distribution, the present optical memory can record the spatial intensity distribution.

Further, an optical memory in accordance with Aspect 5 of one or more embodiments employs, in addition to the abovementioned configuration of the optical memory in accordance with any one of Aspect 1 to 4, a configuration in which each of the nanoparticles and the support are made of an optically transparent material.

With the above configuration, light for writing that has entered the optical memory is outputted to the downstream of the optical memory. Thus, the present optical memory can be arranged at a stage that precedes another optical element (e.g., light diffraction element). Further, with the above configuration, it is also possible to perform writing on nanoparticles located at the last stage in a case of a multiple-level optical memory in which the plurality of nanoparticles are arranged along the direction normal to the specific face.

A light diffraction element in accordance with Aspect 6 of one or more embodiments includes: a plurality of cells having respective thicknesses or respective refractive indexes set independently of each other; and an optical memory according to any one of Aspects 1 to 5, the optical memory being directly or indirectly disposed on the plurality of cells. In the present light diffraction element, regions each obtained by projecting a bottom face of each of the cells onto the specific face are defined as sections of the optical memory, and one or more nanoparticles of the plurality of nanoparticles are arranged in each of the section.

When light having a spatial intensity distribution enters the light diffraction element, the light diffraction element converts the spatial intensity distribution of the incident light to another spatial intensity distribution in accordance with the thickness or the refractive index of each cell, and then outputs the light having the converted spatial intensity distribution. With the above configuration, the cells and the sections are in one-to-one correspondence, so that it is possible to record the spatial intensity distribution that has been converted by the light diffraction element. Further, like the optical memory in accordance with Aspect 1, the optical memory included in the present light diffraction element can increase the energy efficiency in a phase change in each section. Thus, the present light diffraction element can increase the energy efficiency in a case in which a spatial intensity distribution that has been converted by the light diffraction element is recorded.

A recording method in accordance with Aspect 7 of the one or more embodiments is a recording method that uses an optical memory, the optical memory including a plurality of nanoparticles made of a phase change material that changes in phase between a crystal phase and an amorphous phase when irradiated with light, the nanoparticles being spaced apart from each other in a specific in-plane direction. The present recording method includes: a first step of causing a plurality of signal light waves enter the optical memory, the signal light waves each having a spatial intensity distribution that represents specific information, the plurality of signal light waves being generated at time intervals; and a second step of recording, on the optical memory, each of the signal light waves which serve as light for writing.

With the above configuration, by reading the optical memory on which the respective signal light waves have been written, it is possible to obtain differences in specific information indicated by signal light waves. Since these differences are generated in accordance with time intervals between the signal light waves, it is possible to detect a change in accordance with time intervals in the specific information according to the present recording method. This recording method may be suitably used even in a case in which the time intervals in the specific information are very short (i.e., a case in which changes at very short time intervals are detected).

Further, a recording method in accordance with Aspect 8 of one or more embodiments employs, in addition to the abovementioned configuration of the recording method in accordance with Aspect 7, in the second step, the signal light waves are recorded in different regions of the optical memory. With the above configuration, the signal light waves are recorded in different regions of the optical memory, so that it is possible to easily read specific information indicated by the respective signal light waves, compared to a case in which all of the signal light waves are recorded in the same region.

[Supplementary Note]

The present invention is not limited to the embodiments, but can be altered by a skilled person in the art within the scope of the claims. The present invention also encompasses, in its technical scope, any embodiment derived by combining technical means disclosed in differing embodiments.

REFERENCE SIGNS LIST

1 Light diffraction element
A Microcell

B Base
S Substrate
10, 10A, 10B Optical memories
R1 to R4 First to fourth regions
11, 11A Supports
111, 11A1 Main faces (specific faces)
112, 11A2 Main faces
12, 12A Nanoparticles
121 to 125 First to fifth nanoparticles
20 Recording system

The invention claimed is:

1. A light diffraction element comprising:
cells having respective thicknesses or respective refractive indexes set independently; and
an optical memory, directly or indirectly disposed on the cells, comprising:
a support; and
nanoparticles, each of which changes between a crystal phase and an amorphous phase when irradiated with light, wherein
the nanoparticles are supported by the support and spaced apart from each other in one or both of an in-plane direction of a face of the support and a direction normal to the face of the support, and
one or more of the nanoparticles are disposed in each of sections of the optical memory, wherein each of the sections is a region obtained by projecting a bottom face of each of the cells on to the face of the support.

2. A recording method that uses an optical memory, the recording method comprising:
causing signal light waves to enter the optical memory, wherein
each of the signal light waves has a spatial intensity distribution that represents information, and
the signal light waves are generated at time intervals; and
recording, on the optical memory, each of the signal light waves which serve as light for writing, wherein
the optical memory comprises nanoparticles, each of which changes between a crystal phase and an amorphous phase when irradiated with light, and
the nanoparticles are supported by the support and spaced apart from each other in one or both of an in-plane direction of a face of the support and a direction normal to the face of the support.

3. The recording method according to claim 2, wherein, in the recording, the signal light waves are recorded in different regions of the optical memory.

* * * * *